(12) United States Patent
Kusunoki et al.

(10) Patent No.: US 10,847,223 B2
(45) Date of Patent: Nov. 24, 2020

(54) STORAGE DEVICE

(71) Applicant: TOSHIBA MEMORY CORPORATION, Tokyo (JP)

(72) Inventors: Naoki Kusunoki, Yokohama Kanagawa (JP); Toshiyuki Enda, Yokohama Kanagawa (JP); Hiroki Tokuhira, Kawasaki Kanagawa (JP); Takayuki Miyazaki, Setagaya Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/557,359

(22) Filed: Aug. 30, 2019

(65) Prior Publication Data

US 2020/0294590 A1 Sep. 17, 2020

(30) Foreign Application Priority Data

Mar. 15, 2019 (JP) ................................. 2019-048629

(51) Int. Cl.
  *G11C 13/00* (2006.01)
  *H01L 27/24* (2006.01)

(52) U.S. Cl.
  CPC ........ *G11C 13/0069* (2013.01); *G11C 13/003* (2013.01); *G11C 13/0004* (2013.01); *H01L 27/2409* (2013.01); *H01L 27/2463* (2013.01); *G11C 2013/0078* (2013.01); *G11C 2213/72* (2013.01)

(58) Field of Classification Search
  CPC ............. H01L 27/2409; H01L 27/2427; H01L 27/2463; G11C 13/003; G11C 13/0033; G11C 13/0069; G11C 2013/0078
  See application file for complete search history.

(56) References Cited

U.S. PATENT DOCUMENTS

| | | | |
|---|---|---|---|
| 7,697,317 B2 * | 4/2010 | Shimaoka | G11C 8/08 365/148 |
| 9,025,392 B1 | 5/2015 | Bolandrina et al. | |
| 9,058,869 B2 | 6/2015 | Patapoutian et al. | |
| 9,183,932 B1 * | 11/2015 | Kwon | G11C 13/004 |
| 9,508,426 B2 | 11/2016 | Bedeschi | |

OTHER PUBLICATIONS

Liu et al. "A 130.7-mm2 2-Layer 32-Gb ReRAM Memory Device in 24-nm Technology," IEEE Journal of Solid-State Circuits, vol. 49, No. 1, Jan. 2014, pp. 140-153.

* cited by examiner

*Primary Examiner* — Allison Bernstein
(74) *Attorney, Agent, or Firm* — Kim & Stewart LLP

(57) ABSTRACT

A storage device includes a first group of wirings extending in a first direction, a second group of wirings extending in a second direction, and memory cells between the first and second groups, each including a variable resistance element and a selection element becoming conductive when a voltage greater than a threshold is applied. Va applied across a first cell to be selected satisfies Va>Vd>Vb and Va>Vd>Vc. A first wiring of the first group and a second wiring of the second group are connected to the first cell. A third wiring of the first group and a fourth wiring of the second group are adjacent to the first wiring and the second wiring. Vb, Vc, and Vd are applied across a second cell between the first and fourth wirings, a third cell between the second and third wirings, and a fourth cell between the third and fourth wirings.

16 Claims, 4 Drawing Sheets

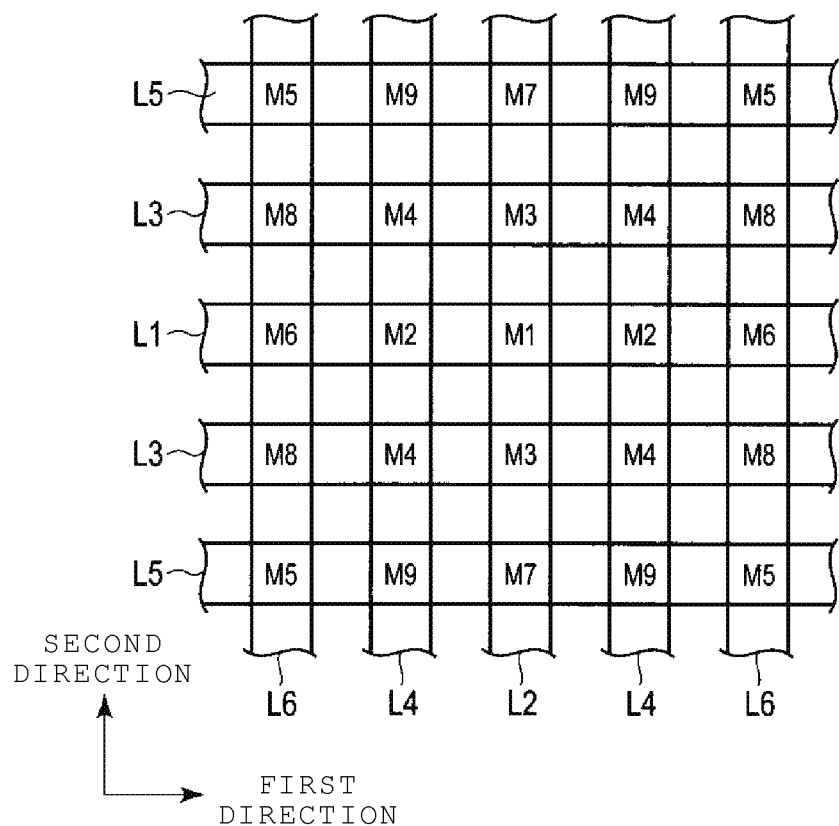

STORAGE DEVICE

CROSS-REFERENCE TO RELATED APPLICATION(S)

This application is based upon and claims the benefit of priority from Japanese Patent Application No. 2019-048629, filed Mar. 15, 2019, the entire contents of which are incorporated herein by reference.

FIELD

Embodiments described herein relate generally to a storage device.

BACKGROUND

Cross-point type storage devices have been developed as semiconductor integrated circuit devices. In such storage devices, memory cells each including a variable resistance element and a selection element are integrated on a semiconductor substrate, and the memory cells are connected between a first group of wirings (e.g., lower layer wirings) and a second group of wirings (e.g., upper layer wirings).

There is need for a cross-point type storage device that can accurately write data onto a target memory cell that is one of a plurality of cells connected to the same wiring.

DESCRIPTION OF THE DRAWINGS

FIG. 3 is a diagram illustrating a voltage application method of the storage device according to the embodiment;

FIG. 4 is a diagram illustrating a voltage application method of the storage device according to the embodiment;

DETAILED DESCRIPTION

Embodiments provide a storage device capable of accurately controlling memory cells.

In general, according to one embodiment, a storage device includes a first group of wirings each extending in a first direction, a second group of wirings each extending in a second direction intersecting the first direction, a plurality of memory cells electrically connected between the first and second groups of wirings, each memory cell including a variable resistance element having a first state and a second state where a resistance thereof is higher than that in the first state, and a selection element that is electrically connected to the variable resistance element in series and becomes conductive when a voltage greater than a threshold voltage is applied across the memory cell. A voltage Va, which is greater than the threshold voltage and applied across a first memory cell to be selected, satisfies the following relationships: $Va>Vd>Vb$ and $Va>Vd>Vc$. A first wiring is a wiring of the first group connected to the first memory cell. A second wiring is a wiring of the second group connected to the first memory cell. A third wiring is a wiring of the first group adjacent to the first wiring. A fourth wiring is a wiring of the second group adjacent to the second wiring. Vb is a voltage applied across a second memory cell between the first and fourth wirings. Vc is a voltage applied across a third memory cell between the second and third wirings. Vd is a voltage applied across a fourth memory cell between the third and fourth wirings.

Hereinafter, embodiments of the present disclosure will be described with reference to the accompanying drawings.

Figure 1:
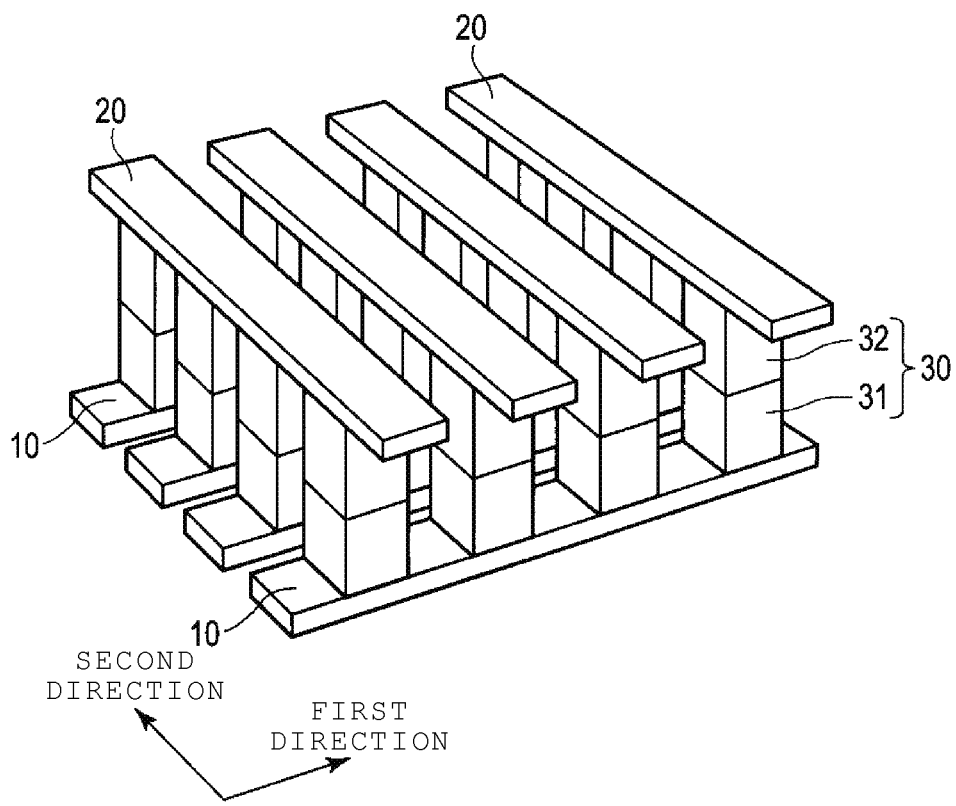
FIG. 1 is a perspective view of a storage device according to one embodiment.

FIG. 1 is a perspective view a storage device according to one embodiment.

As illustrated in FIG. 1, the storage device according to the present embodiment is a cross-point type non-volatile storage device in which a plurality of memory cells 30 are provided between a plurality of wirings 10 in a first wiring group and a plurality of wirings 20 in a second wiring group. In the present embodiment, lower layer wirings correspond to the wirings 10 in the first wiring group, and upper layer wirings correspond to the wirings 20 in the second wiring group.

The wirings 10 in the first wiring group extend in a first direction, and the wirings 20 in the second wiring group extend in a second direction. The wirings 10 and the wirings 20 intersect each other. Specifically, the wirings 10 and the wirings 20 are perpendicular to each other. One of the wiring 10 and the wiring 20 corresponds to a word line, and the other one of the wiring 10 and the wiring 20 corresponds to a bit line.

The memory cell 30 is connected between the corresponding wiring 10 and the corresponding wiring 20 and includes a variable resistance element 31 and a selection element 32 connected to the variable resistance element 31 in series. Specifically, the memory cells 30 have a structure in which the variable resistance element 31 and the selection element 32 are stacked in a third direction perpendicular to the first direction and the second direction. Meanwhile, the example illustrated in FIG. 1 has a configuration in which the selection element 32 is stacked on the variable resistance element 31. In contrast, a configuration in which the variable resistance element 31 is stacked on the selection element 32 may be adopted.

The variable resistance element 31 has a low resistance state and a high resistance state where the resistance is higher than that in the low resistance state. Therefore, it is possible to store binary data (i.e., 0 or 1) in accordance with the resistance state (i.e., the low resistance state and the high resistance state). In the present embodiment, a phase change memory (PCM) element is used as the variable resistance element 31.

The selection element 32 selects the variable resistance element 31 connected to the selection element 32 in series. In the present embodiment, a two-terminal selection element having a non-linear current-voltage characteristic is used as the selection element 32. Specifically, a two-terminal switch element including a diode or a chalcogen element may be used for the selection element 32.

In the two-terminal switch element including a chalcogen element, the two-terminal switch element is in a high resistance state (e.g., an electrically non-conducted state) when a voltage applied between two terminals is smaller than a threshold voltage. When a voltage applied between two terminals is larger than the threshold voltage, the two-terminal switch element is in a low resistance state (e.g., an electrically conducted state). The two-terminal switch element may have the above-described function bidirectionally. The above-described switch element includes at least one chalcogen element selected from the group consisting of Te, Se, and S. Alternatively, the switch element may include a chalcogenide which is a compound containing these chalcogen elements. In addition, the above-described switch element may include at least one element selected from the group consisting of B, Al, Ga, In, C, Si, Ge, Sn, As, P, and Sb.

Figure 2:
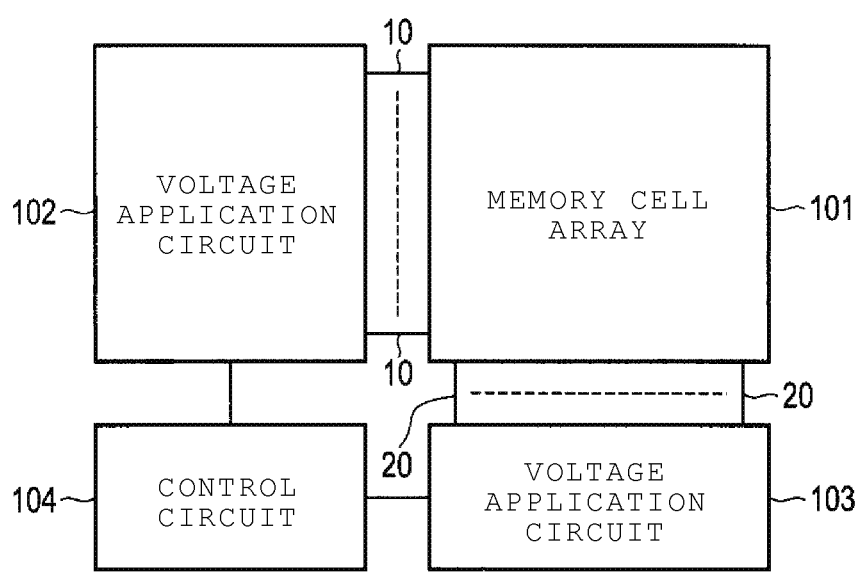
FIG. 2 is a block diagram illustrating the storage device according to the embodiment.

FIG. 2 is a block diagram illustrating the storage device according to the embodiment.

The storage device illustrated in FIG. 2 includes a memory cell array region 101, a voltage application circuit 102, a voltage application circuit 103, and a control circuit 104. The memory cell array region 101 is a region in which the plurality of memory cells 30 illustrated in FIG. 1 are arranged. The voltage application circuit 102 applies a voltage to the wiring 10 illustrated in FIG. 1. The voltage application circuit 103 applies a voltage to the wiring 20 illustrated in FIG. 1. The control circuit 104 controls the voltage application circuit 102 and the voltage application circuit 103.

Next, a voltage application method in the storage device according to the present embodiment will be described.

In a cross-point type storage device of the related art, a voltage of −V/2 is applied to the wiring 10 connected to a selected memory cell, and a voltage of +V/2 is applied to the wiring 20 connected to the selected memory cell. A voltage of 0 V is applied to the other unselected wirings 10 and unselected wirings 20. As a result, a voltage V is applied to the selected memory cell, and a voltage V/2 (i.e., semi-select voltage) is applied to the memory cells connected between the selected wiring 10 and the unselected wiring 20 and between the selected wiring 20 and the unselected wiring 10. For this reason, the memory cells adjacent to the selected memory cell (i.e., the memory cells to which a semi-select voltage is applied) may be influenced by heat generated by the selected memory cell, and some memory cells which have to be unselected may be erroneously selected.

In the present embodiment, a voltage application method to be described below prevents such memory cells that need to be unselected from being erroneously selected.

FIG. 3 is a diagram illustrating a voltage application method of the present embodiment. In FIG. 3, for the convenience of description, the wirings 10 illustrated in FIG. 1 are represented by wirings L1, L3, and L5, the wirings 20 illustrated in FIG. 1 are represented by wirings L2, L4, and L6, and the memory cells 30 illustrated in FIG. 1 are represented by M1 to M9. Hereinafter, a case where the memory cell M1 in the center of FIG. 3 is selected will be described.

As illustrated in FIG. 3, a selected memory cell is specified as a first memory cell M1, the wiring 10 which is connected to the first memory cell M1 is specified as a first wiring L1, the wiring 20 which is connected to the first memory cell M1 is specified as a second wiring L2, the wiring 10 which is adjacent to the first wiring L1 is specified as a third wiring L3, the wiring 20 which is adjacent to the second wiring L2 is specified as a fourth wiring L4, the wiring 10 which is not adjacent to the first wiring L1 is specified as a fifth wiring L5, and the wiring 20 which is not adjacent to the second wiring L2 is specified as a sixth wiring L6.

In addition, a memory cell which is connected between the first wiring L1 and the fourth wiring L4 is specified as a second memory cell M2, a memory cell which is connected between the second wiring L2 and the third wiring L3 is specified as a third memory cell M3, a memory cell which is connected between the third wiring L3 and the fourth wiring L4 is specified as a fourth memory cell M4, a memory cell which is connected between the fifth wiring L5 and the sixth wiring L6 is specified as a fifth memory cell M5, a memory cell which is connected between the first wiring L1 and the sixth wiring L6 is specified as a sixth memory cell M6, a memory cell which is connected between the second wiring L2 and the fifth wiring L5 is specified as a seventh memory cell M7, a memory cell which is connected between the third wiring L3 and the sixth wiring L6 is specified as an eighth memory cell M8, and a memory cell which is connected between the fourth wiring L4 and the fifth wiring L5 is specified as a ninth memory cell M9.

In addition, as illustrated in FIG. 4, a voltage to be applied to the first memory cell M1 is set to be Va, a voltage to be applied to the second memory cell M2 is set to be Vb, a voltage to be applied to the third memory cell M3 is set to be Vc, a voltage to be applied to the fourth memory cell M4 is set to be Vd, and a voltage to be applied to the fifth memory cell M5 is set to be Ve. In this case, relationships of "Va>Vd>Vb" and "Va>Vd>Vc" are satisfied. In addition, more preferably, relationships of "Va>Vd>Vb>Ve" and "Va>Vd>Vc>Ve" are satisfied.

In addition, it is preferable that the voltage Va to be applied to the first memory cell M1 and the voltage Vb to be applied to the second memory cell M2 satisfy a relationship of "Va/2>Vb>0", and it is preferable that the voltage Va to be applied to the first memory cell M1 and the voltage Vc to be applied to the third memory cell M3 satisfy a relationship of "Va/2>Vc>0".

Further, preferably, the voltage Vd to be applied to the fourth memory cell M4, the voltage Ve to be applied to the fifth memory cell M5, a voltage Vf to be applied to the sixth memory cell M6, a voltage Vg to be applied to the seventh memory cell M7, a voltage Vh to be applied to the eighth memory cell M8, and a voltage Vi to be applied to the ninth memory cell M9 satisfy relationships of "Va/2≥Vd>0", "Va/2≥Ve>0", "Va/2≥Vf>0", "Va/2≥Vg>0", "Va/2≥Vh>0", and "Va/2≥Vi>0". In addition, preferably, relationships of "Vf>Ve", "Vg>Ve", "Vh>Ve", and "Vi>Ve" are satisfied.

In addition, it is preferable that relationships of "Vb=Vc" and "Vf=Vg=Vh=Vi" are satisfied.

By satisfying the above-described voltage relationships, memory cells which have to be unselected are not erroneously selected, and accurate control of the memory cells can be achieved. Additional explanations will be described below.

As described above, in a voltage application method of the related art, a voltage V/2 (i.e., semi-select voltage) is applied to the memory cells (i.e., M2 and M6) connected between a selected wiring 10 (i.e., L1) and unselected wirings 20 (i.e., L4 and L6) and the memory cells (i.e., M3 and M7) connected between a selected wiring 20 (i.e., L2) and unselected wirings 10 (i.e., L3 and L5). In particular, the memory cell (i.e., M2) adjacent to the selected memory cell (i.e., M1) in the first direction, and the memory cell (i.e., M3) adjacent to the selected memory cell (i.e., M1) in the second direction are closest to the selected first memory cell M1. For this reason, the second memory cell M2 and the third memory cell M3 may be strongly influenced by heat generated by the selected first memory cell M1, and the second memory cell M2 and the third memory cell M3 which have to be unselected may be erroneously selected.

In the voltage application method of the present embodiment, the voltage Va to be applied to the first memory cell M1, the voltage Vb to be applied to the second memory cell M2, and the voltage Vc to be applied to the third memory cell M3 satisfy the relationships: "Va/2>Vb>0" and "Va/2>Vc>0". That is, a voltage smaller than half the voltage to be applied to the first memory cell M1 is applied to the second memory cell M2 and the third memory cell M3.

Accordingly, it is possible to accurately prevent the second memory cell M2 and the third memory cell M3 which have to be unselected from being erroneously selected.

Further, in the voltage application method of the present embodiment, the voltage Vd to be applied to the fourth memory cell M4 adjacent to the first memory cell M1 in an oblique direction satisfies the relationship of "Va/2≥Vd>0". Accordingly, it is also possible to accurately prevent the fourth memory cell M4 from being erroneously selected.

In addition, generally, voltages having opposite polarities and equal absolute values are preferably applied to the selected wiring 10 (L1) and the selected wiring 20 (L2). For example, a voltage to be applied to the first wiring L1 is set to be "−Va/2" and a voltage to be applied to the second wiring L2 is set to be "+Va/2". In addition, voltages having opposite polarities and equal absolute values are preferably applied to the third wiring L3 and the fourth wiring L4. In addition, voltages having opposite polarities are preferably applied to the first wiring L1 and the third wiring L3, and voltages having opposite polarities are preferably applied to the second wiring L2 and the fourth wiring L4. For example, a voltage to be applied to the third wiring L3 is set to be "+Vd/2" and a voltage to be applied to the fourth wiring L4 is set to be "−Vd/2". In addition, a voltage of zero (0 V) is preferably applied to both the fifth wiring L5 and the sixth wiring L6.

When the above-described voltages are applied to the wirings 10 and the wirings 20, the voltage to be applied to the first memory cell M1 is Va and the voltage to be applied to the fourth memory cell M4 is Vd. In addition, the voltage Vb to be applied to the second memory cell M2 and the voltage Vc to be applied to the third memory cell M3 are both (Va−Vd)/2. As described above, in the voltage application method of the present embodiment, the voltage Vb to be applied to the second memory cell M2 and the voltage Vc to be applied to the third memory cell M3 are smaller than the voltage Vd to be applied to the fourth memory cell M4. Therefore, a relationship of "Vd>(Va−Vd)/2" is satisfied. From this relationship, a relationship of "Vd>Va/3" is obtained. In addition, as described above, preferably, a relationship of "Va/2≥Vd" is satisfied. Therefore, preferably, a relationship of "Va/2≥Vd>Va/3" is satisfied.

For example, the above-described relationships are satisfied when a voltage to be applied to the first wiring L1 is set to be "−Va/2", a voltage to be applied to the second wiring L2 is set to be "+Va/2", a voltage to be applied to the third wiring L3 is set to be "+Va/4", and a voltage to be applied to the fourth wiring L4 is set to be "−Va/4". In this case, the voltage to be applied to the first memory cell M1 is "Va", the voltage to be applied to the second memory cell M2 and the third memory cell M3 is "Va/4", and the voltage to be applied to the fourth memory cell M4 is "Va/2".

In the above-described embodiment, when the wirings 10 in the first wiring group are lower layer wirings and the wirings 20 in the second wiring group are upper layer wirings as illustrated in FIG. 1, a relationship of "Vb>Vc" may be satisfied. Hereinafter, a modification example satisfying such a relationship will be described. Meanwhile, the basic matters are the same as in the above-described embodiment.

Figure 5:
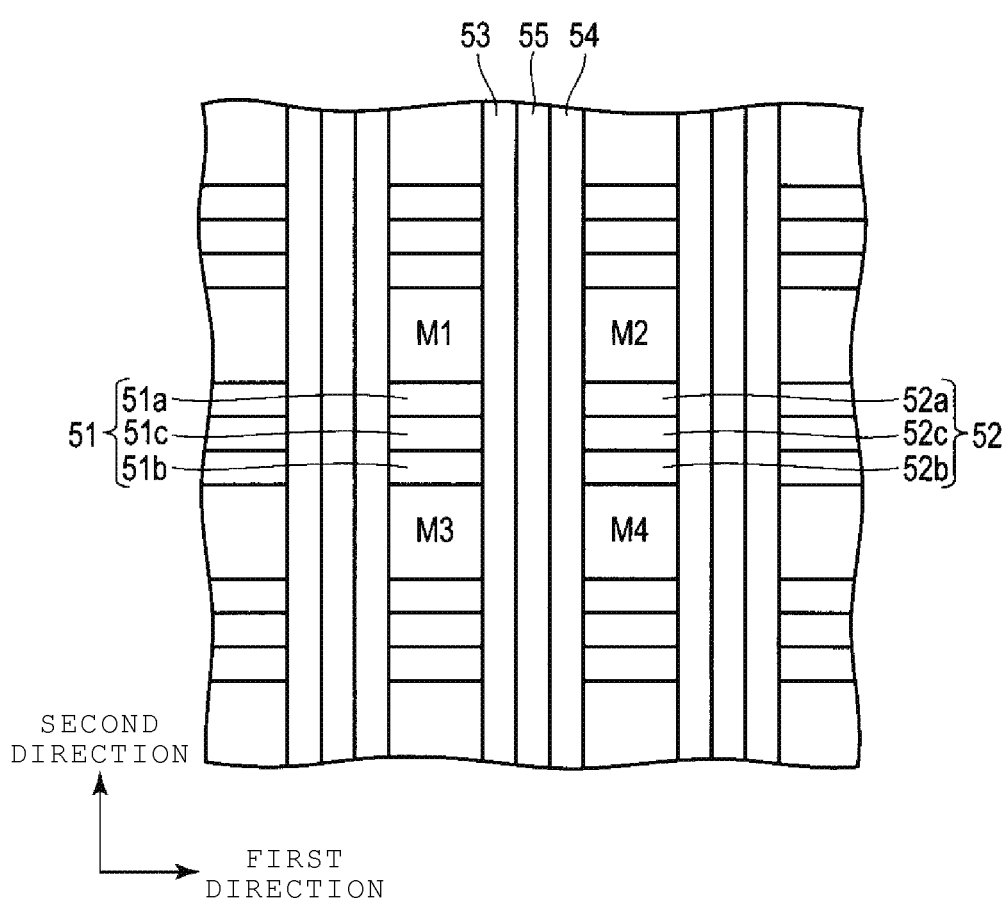
FIG. 5 is a plan view of a modification example of the storage device according to the embodiment.

FIG. 5 is a plan view of a storage device according to a modification example.

As illustrated in FIG. 5, a first insulating portion 51 is provided between the first memory cell M1 and the third memory cell M3, and a second insulating portion 52 is provided between the second memory cell M2 and the fourth memory cell M4. The first insulating portion 51 includes a first portion 51a, a second portion 51b, and a third portion 51c formed between the first portion 51a and the second portion 51b. The second insulating portion 52 includes a first portion 52a, a second portion 52b, and a third portion 52c formed between the first portion 52a and the second portion 52b.

In addition, a third insulating portion 53, a fourth insulating portion 54, and a fifth insulating portion 55 are provided between a first structure, which includes the first memory cell M1, the third memory cell M3, and the first insulating portion 51, and a second structure, which includes the second memory cell M2, the fourth memory cell M4, and the second insulating portion 52. The third insulating portion 53 continuously extends in the second direction along a side surface of the first structure facing the second structure. The fourth insulating portion 54 continuously extends in the second direction along a side surface of the second structure facing the first structure. The fifth insulating portion 55 is provided between the third insulating portion 53 and the fourth insulating portion 54 and continuously extends in the second direction.

The first portion 51a and the second portion 51b of the first insulating portion 51, the first portion 52a and the second portion 52b of the second insulating portion 52, the third insulating portion 53, and the fourth insulating portion 54 are side wall insulating films and are formed of the same insulating material (e.g., a silicon nitride). The third portion 51c of the first insulating portion 51, the third portion 52c of the second insulating portion 52, and the fifth insulating portion 55 are inter-cell insulating films and are formed of the same insulating material (e.g., a silicon oxide). Wirings 10 (i.e., lower layer wirings, not shown in FIG. 5) extend in the first direction, and wirings 20 (i.e., upper layer wirings, not shown in FIG. 5) extend in the second direction.

Figure 6:
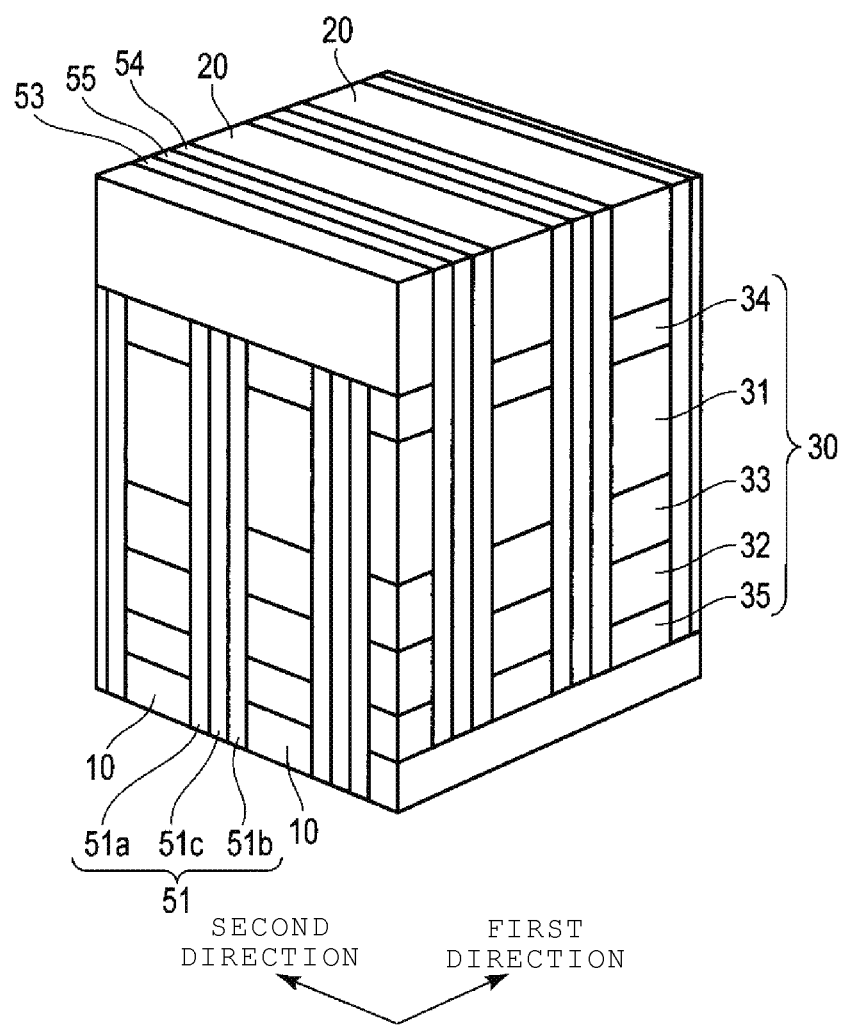
FIG. 6 is a perspective view of the modification example of the storage device according to the embodiment.

FIG. 6 is a perspective view of the storage device in the modification example illustrated in FIG. 5.

In FIG. 6, the memory cell 30, which corresponds to memory cells M1 to M4 in FIG. 5, includes the variable resistance element 31, the selection element 32, and electrodes 33, 34 and 35. In addition, the wirings 10 (i.e., the lower layer wirings) extend in the first direction, and the wirings 20 (i.e., the upper layer wirings) extend in the second direction.

The structure as illustrated in FIGS. 5 and 6 is generally formed through the following process.

First, a lower layer wiring film and a memory cell film are formed on a lower region (not shown) provided with a transistor and the like. Subsequently, the lower layer wiring film and the memory cell film are patterned to form a line-and-space pattern. A line pattern and a space pattern extend in the first direction. Subsequently, a side wall insulating film (e.g., a silicon nitride film) is formed on a side wall of the line pattern. Further, an insulating film (e.g., a silicon oxide film) is formed in a space between the adjacent side wall insulating films.

Next, an upper layer wiring film is stacked on the structure obtained in the above-described process, and then patterning is performed thereon to form a line-and-space pattern. A line pattern and a space pattern extend in the second direction. A plurality of memory cells separated from each other are formed through the patterning. Subsequently, a side wall insulating film (e.g., a silicon nitride film) is formed on a side wall of the line pattern. Further, an insulating film (e.g., a silicon oxide film) is formed in a space between adjacent side wall insulating films.

The structure as illustrated in FIGS. 5 and 6 is obtained through the above-described process.

As illustrated in FIGS. 5 and 6, the side wall insulating films (i.e., the third insulating portion 53 and the fourth insulating portion 54) extend in the second direction, and thus the heat generated by a selected memory cell conducts the side wall insulating films in the second direction. As a result, the influence on memory cells adjacent to each other in the second direction increases as compared to those in the first direction.

Therefore, in the present modification example, the voltage Vb to be applied to the second memory cell M2 which is adjacent to the selected first memory cell M1 in the first direction (i.e., the direction in which the lower layer wirings 10 extend) is larger than the voltage Vc to be applied to the third memory cell M3 which is adjacent to the selected first memory cell M1 in the second direction (i.e., the direction in which the upper layer wirings 20 extend). That is, a relationship of "Vb>Vc" is satisfied.

In this manner, in the present modification example, when the wirings 10 are lower layer wirings and the wirings 20 are upper layer wirings, a relationship of "Vb>Vc" is satisfied, and thus it is possible to prevent an erroneous operation of a memory cell due to asymmetrical heat transfer.

Meanwhile, in the above-described embodiment and modification example, a PCM element is used as the variable resistance element 31, but other variable resistance elements may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
   a first group of wirings each extending in a first direction;
   a second group of wirings each extending in a second direction intersecting the first direction; and
   a plurality of memory cells electrically connected between the first and second groups of wirings, each memory cell including
      a variable resistance element having a first state and a second state where a resistance thereof is higher than that in the first state, and
      a selection element that is electrically connected to the variable resistance element in series and becomes conductive when a voltage greater than a threshold voltage is applied across the memory cell, wherein
   a voltage Va, which is greater than the threshold voltage and applied across a first memory cell to be selected, satisfies the following relationships:
   Va>Vd>Vb and Va>Vd>Vc, where
      a first wiring is a wiring of the first group connected to the first memory cell,
      a second wiring is a wiring of the second group connected to the first memory cell,
      a third wiring is a wiring of the first group adjacent to the first wiring,
      a fourth wiring is a wiring of the second group adjacent to the second wiring,
      Vb is a voltage applied across a second memory cell between the first and fourth wirings,
      Vc is a voltage applied across a third memory cell between the second and third wirings, and
      Vd is a voltage applied across a fourth memory cell between the third and fourth wirings.

2. The storage device according to claim 1, wherein the following relationships are further satisfied:
   Va>Vd>Vb>Ve and Va>Vd>Vc>V, where
      a fifth wiring is a wiring of the first group not adjacent to the first wiring,
      a sixth wiring is a wiring of the second group not adjacent to the second wiring, and
      Ve is a voltage applied across a fifth memory cell between the fifth and sixth wirings.

3. The storage device according to claim 1, wherein Va, Vb, and Vc satisfy the following relationships:
   Va/2>Vb>0 and Va/2>Vc>0.

4. The storage device according to claim 1, wherein Va and Vd satisfy the following relationship:
   Va/2≥Vd>0.

5. The storage device according to claim 1, wherein Va and Vd satisfy the following relationship:
   Va/2≥Vd>Va/3.

6. The storage device according to claim 1, wherein the variable resistance element and the selection element are stacked in a third direction perpendicular to the first and second directions.

7. The storage device according to claim 1, wherein the selection element is a two-terminal selection element having a non-linear current-voltage characteristic.

8. The storage device according to claim 1, wherein the first group of wirings are lower layer wirings, the second group of wirings are upper layer wirings.

9. The storage device according to claim 8, wherein Vb and Vc satisfy the following relationship:
   vb>vc.

10. The storage device according to claim 1, wherein the variable resistance element is a phase change memory element.

11. The storage device according to claim 1, wherein the first group of wirings and the second group of wirings are perpendicular to each other.

12. A storage device comprising:
   a plurality of lower layer wirings each extending in a first direction;
   a plurality of higher layer wirings each extending in a second direction intersecting the first direction; and
   a plurality of memory cells electrically connected between the lower layer wirings and the higher layer wirings, each memory cell including
      a variable resistance element having a first state and a second state where a resistance thereof is higher than that in the first state, and
      a selection element electrically connected to the variable resistance element in series and stacked on the variable resistance element in a third direction perpendicular to the first and second directions, the selection element becoming conductive when a voltage greater than a threshold voltage is applied across the memory cell, wherein
   voltages Vb and Vc, which are respectively applied across second and third memory cells other than a first memory cell to be selected, satisfy the following relationship:
   Vb>Vc, where a first wiring is a lower layer wiring connected to the first memory cell, a second wiring is a higher layer wiring connected to the first memory cell, a third wiring is a lower layer wiring adjacent to the first wiring, a fourth wiring is a higher layer wiring adjacent to the second wiring, the second memory cell is electrically connected between the first and fourth wirings, and the third memory cell is electrically connected between the second and third wirings.

13. The storage device according to claim 12, further comprising:
   a first insulating portion between the first and third memory cells;
   a second insulating portion between the second memory cell and a fourth memory cell, the fourth memory cell being electrically connected between the third and fourth wirings;
   a third insulating portion between a first structure including the first memory cell, the third memory cell, and the first insulating portion, and a second structure including the second memory cell, the fourth memory cell, and the second insulating portion,
   the third insulating portion continuously extending in the second direction along a side surface of the first structure facing the second structure;
   a fourth insulating portion between the first and second structures and continuously extending in the second direction along a side surface of the second structure facing the first structure; and
   a fifth insulating portion between the third and fourth insulating portions and continuously extending in the second direction.

14. The storage device according to claim 12, wherein the selection element is a two-terminal selection element having a non-linear current-voltage characteristic.

15. The storage device according to claim 12, wherein the variable resistance element is a phase change memory element.

16. The storage device according to claim 12, wherein the lower layer wirings and the higher layer wirings are perpendicular to each other.

* * * * *